United States Patent [19]

Goodman et al.

[11] Patent Number: 5,121,415
[45] Date of Patent: Jun. 9, 1992

[54] ADJUSTING FILTER COEFFICIENTS

[75] Inventors: David J. Goodman, Cliffwood Beach, N.J.; Mustafa K. Gurcan, Crawley, England

[73] Assignee: U.S. Philips Corporation, New York, N.Y.

[21] Appl. No.: 649,137

[22] Filed: Jan. 29, 1991

Related U.S. Application Data

[63] Continuation of Ser. No. 241,634, Sep. 8, 1988, abandoned.

[30] Foreign Application Priority Data

Sep. 9, 1987 [GB] United Kingdom ............... 8721159

[51] Int. Cl.⁵ ............................................. H04B 1/10
[52] U.S. Cl. ..................................... 375/103; 375/14; 364/728.01
[58] Field of Search ............ 375/12, 13, 14, 15, 375/102, 103; 333/18; 364/604, 724.01, 724.12, 724.19, 724.2, 728.01

[56] References Cited

U.S. PATENT DOCUMENTS

| | | | |
|---|---|---|---|
| 4,262,360 | 4/1981 | Bigio et al. | 375/15 |
| 4,320,517 | 3/1982 | Godard et al. | 333/18 |
| 4,334,313 | 6/1982 | Gitlin et al. | 364/724 |
| 4,376,308 | 3/1983 | McNair | 375/14 |
| 4,386,430 | 5/1983 | Treiber | 333/18 |
| 4,550,415 | 10/1985 | Debus, Jr. | 364/724 |
| 4,577,732 | 2/1986 | Pirani et al. | 375/12 |
| 4,580,275 | 4/1986 | Pirani et al. | 375/14 |
| 4,718,073 | 1/1988 | Takaoka | 375/14 |

Primary Examiner—Stephen Chin
Attorney, Agent, or Firm—Leroy Eason

[57] ABSTRACT

In an adaptive filter (56) the coefficients of a transversal filter (64) are adjusted by a processing circuit (78) to reduce the difference between a signal applied to the filter input (55) and a reference signal applied to a further input (57) so that the filter transfer characteristic becomes such that it will convert a first signal into a second signal. The first and second signals are constituted by a signal occurring in a signal path through a communications receiver and an ideal version of this signal respectively. In order that a relatively simple but hence relatively slow algorithm can be employed by the processing circuit without requiring a correspondingly long first signal the first and second signals are not applied to the adaptive filter directly but only after convolution in respective transversal filters (49,62) with the output of a noise source (60). The adaptive filter is then used as an equalizer in the receiver.

24 Claims, 3 Drawing Sheets

ADJUSTING FILTER COEFFICIENTS

This is a continuation of application Ser. No. 07/241,634, filed Sept. 8, 1988 now abandoned.

BACKGROUND OF THE INVENTION

This invention relates to a method of adjusting the coefficients of a filter means, in which method an input signal is supplied to the filter means, a resulting signal derived from the filter means is compared with a reference signal, and the coefficients are adjusted to reduce the difference between the compared signals. The invention also relates to an arrangement comprising a filter means provided with coefficient adjusting means for, when activated, supplying an input signal to the filter means, comparing a resulting signal derived from the filter means with a reference signal, and adjusting the coefficients to reduce the difference between the compared signals.

Filters are often employed, for example, as so-called "equalizers" for compensating for distortion to a transmitted signal caused by the imperfect nature of a transmission channel. If the channel characteristics vary with time then, in order that satisfactory equalization continues to be achieved, it is necessary that the filter transfer characteristic be updated either effectively continuously or periodically to take into account the changed channel characteristics. In the latter case it is often arranged that a standard signal, i.e. one which is known at the receiver, is transmitted periodically. Each time this standard signal is received, albeit in possibly distorted form, it can be passed through the receiver equalizing filter and the result compared with what it ideally should be. Any differences revealed by the comparison can be used to adjust the filter coefficients in such a way as to reduce these differences, i.e. in such a way as to create a transfer characteristic for the filter which is such as to convert the distorted signal received substantially into the signal originally transmitted. These adjusted coefficients are then maintained until the standard signal is received once again, at which point another adjustment to the coefficients is performed. Many algorithms have been proposed for achieving the required coefficient adjustments. In general these algorithms cause the coefficients to approach the required values as successive portions of the standard signal are received and processed, the rate at which this approach occurs being a function of the particular algorithm employed. Those algorithms which give a comparatively fast rate of approach tend to require very large amounts of computation whereas those algorithms which are more reasonable in respect of their demands on computing power tend to give a comparatively slow rate of approach. In consequence, if the amount of computation is to be kept to within reasonable bounds an algorithm which gives a comparatively slow rate of approach has to be used, with the result that the "standard signal" has to be, each time it occurs, of a comparatively long duration to enable the algorithm to achieve the accuracy of which it is inherently capable. However, employing a "standard signal" of a comparatively long duration reduces the efficiency of transmission through the transmission channel, because the standard signal displaces useful information which could otherwise be transferred at the relevant time.

SUMMARY OF THE INVENTION

It is an object of the present invention to mitigate this disadvantage and to this end, according to one aspect of the invention, a method as defined in the first paragraph is characterised in that the input signal and the reference signal, and hence the compared signals, are both derived from a common auxiliary signal source, a said compared signal being derived from the output signal of the source via at least a convolution operation with a first further signal and a said compared signal being derived from the output signal of the source via, at least effectively, at least a convolution operation with a second further signal.

It has now been found that it is not essential when a method as defined in the first paragraph is used for example to adjust the coefficients of an equalizer that the said input signal is in the form of the received standard signal and the said reference signal is in the form of what the received standard signal should ideally be signal; the required adjustment of the coefficients of the equalising filter can still be obtained if, for example, the input signal is obtained by convolving the received standard signal with an auxiliary signal and the reference signal is obtained by convolving what the received standard signal should ideally be with the auxiliary signal. Because there is in principle no upper limit on the length or duration of the auxiliary signal employed, the required adjustment of the coefficients can be achieved using a comparatively slow and simple algorithm even though the duration of the received standard signal and/or what the received standard signal should ideally be may be short.

Communication receivers often employ quadrature mixers to separate the received signal into quadrature components thereof. In order inter alia to enable both these quadrature components to be utilised in a method according to the invention, according to another aspect the invention provides a method as defined in the first paragraph which is characterised in that the input signal and the reference signal, and hence the compared signals, are both derived from in auxiliary signal source having a pair of outputs for respective ones of mutually orthogonal auxiliary signals, a said compared signal being derived from both of the output signals of the source via at least respective convolution operations with respective quadrature components of a first further signal and combination of signals derived from said convolution operations and a said compared signal being derived from at least one of the output signals of the source via, at least effectively, at least a convolution operation with a second further signal.

In order that optimum results can be obtained the auxiliary signal source is preferably a wide-band signal source, preferably a noise signal source such as a random or pseudo-random number generator.

According to another aspect the invention provides an arrangement as defined in the first paragraph which is characterised in that the arrangement includes an auxiliary signal source and means for deriving, when the coefficient adjusting means is activated, both said input signal and said reference signal, and hence both the compared signals, from the output signal of said auxiliary signal source in such manner that a said compared signal is so derived via at least a convolution operation with a first further signal and a said compared signal is so derived from the output signal of the source via, at least effectively, at least a convolution operation with a second further signal.

According to yet another aspect an arrangement as defined in the first paragraph is characterised in that the arrangement includes an auxiliary signal source having a pair of outputs for respective ones of mutually orthogonal input signals and means for deriving, when the coefficient adjusting means is activated, both said input signal and said reference signal, and hence both the compared signals, from said auxiliary signal source in such manner that a said component signal is derived from both of the output signals of the source via at least respective convolution operations with respective quadrature components of a first further signal and combination of signals derived from said convolution operations and a said compared signal is derived from at least one of the output signals of the source via, at least effectively, at least a convolution operation with a second further signal.

BRIEF DESCRIPTION OF THE INVENTION

Embodiments of the invention will now be described, by way of example, with reference to the accompanying diagrammatic drawings in which FIG. 1 shows a possible format for the modulation of a radio signal, FIG. 2 is a block diagram of a communications receiver embodying the invention, and FIG. 3 and 4 are block diagrams of a possible alternative to part of the receiver of FIG. 2.

DETAILED DESCRIPTION OF THE INVENTION

Figure 1:
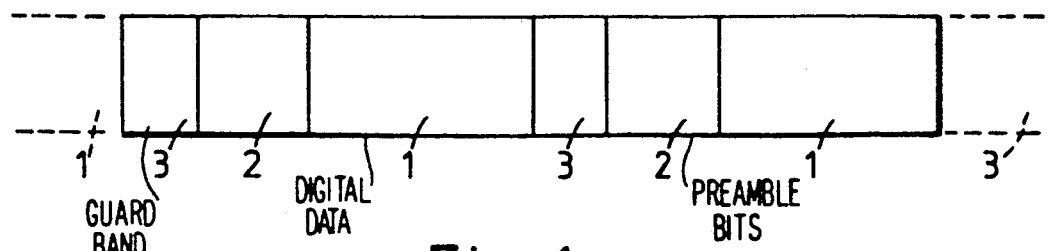

FIG. 1 shows, diagrammatically, a possible format for the transmission of digital data from a transmitter to a receiver. The format shown employs a so-called "burst" mode in which groups 1 of digital data bits are transmitted periodically, each group 1 being preceded by a preamble 2 and being separated from the next preamble by a guard band 3. Each preamble 2 comprises a specific sequence of bits which may be, for example, twenty-six bits long. Each group 1 of bits may comprise, in addition to a specific number of actual data bits, a specific number of further bits which may be employed for error correction purposes. Each successive combination of a guard band 3, a preamble 2, and a group 1 of data bits is termed a frame. If desired time-division multiplex may be used in which every nth group 1, for example every eighth group 1, comprises information intended for a particular receiver or group of receivers, in which case it will contain an identifier for that receiver or group of receivers, the other groups than being intended for other specific receivers or groups of receivers and containing identifiers therefor. The data having the format shown may be modulated on an r.f. carrier, for example using phase or frequency shift keying techniques.

Figure 2:
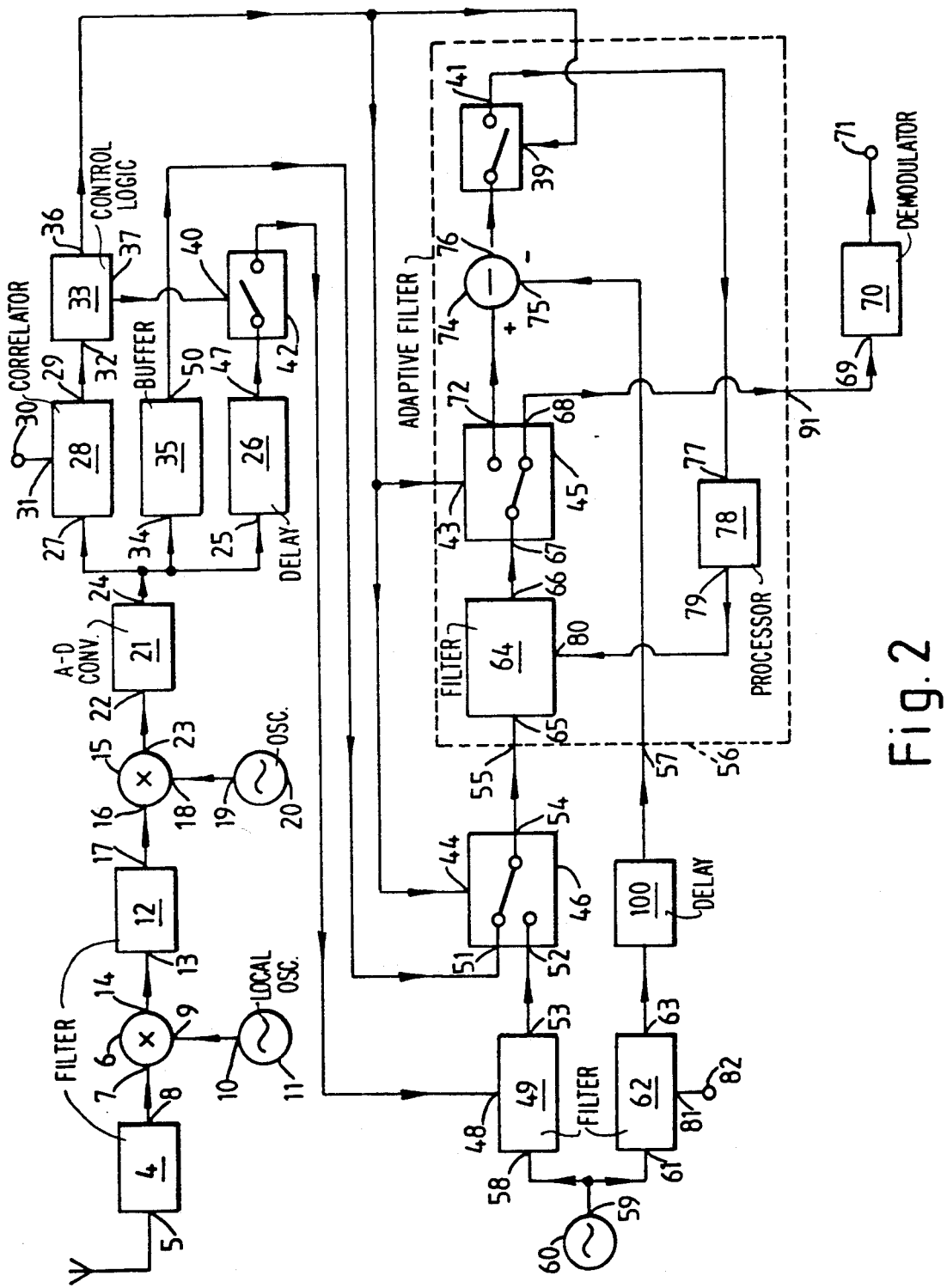

FIG. 2 is a block diagram of a receiver for a transmission having the format shown in FIG. 1. The receiver comprises, in conventional manner, an R.F. amplifier and filter 4 to an input 5 of which an aerial is connected, a first mixer stage 6 to a first input 7 of which the output 8 of the R.F. amplifier 4 is connected and to a second input 9 of which the output 10 of a first local oscillator 11 is connected, an I.F. amplifier and filter 12 to the input 13 of which the output 14 of mixer 6 is connected, and a second mixer 15 to a first input 16 of which the output 17 of I.F. amplifier and filter 12 is connected and to a second input 18 of which the output 19 of a second local oscillator 20 is connected. The first mixer stage 6 translates the desired signal received by the aerial to a suitable first IF frequency, the output frequency of oscillator 11 being chosen accordingly. The output frequency of oscillator 20 is chosen so that the second mixer stage 15 translates the first IF frequency output signal of amplifier 12 to a second, low, IF frequency. The low IF output signal of mixer 15 is sampled and converted to digital form by means of a filter and analog-to-digital converter 21 to the input 22 of which the output 23 of mixer 15 is connected.

The output 24 of filter and A/D converter 21 is connected to the inputs 25 and 34 of multi-stage buffers or delay elements 26 and 35 respectively and to the input 27 of a correlator 28. Correlator 28 correlates or convolves the output signal of A/D converter 21 with a replica of the low IF-translated preamble 2 of FIG. 1 and produces a signal on its output 29 the magnitude of which is representative of the degree of correlation occurring at any given time. The said replica is previously entered into correlator 28 via a terminal 30 and a further input 31. The output 29 is connected to an input 32 of control logic circuitry 33 which has outputs 36 and 37. Output 36 is connected to control inputs 39, 43 and 44 of switches 41, 45 and 46 respectively and output 37 is connected to the control input 40 of switch 42.

The output 47 of buffer 26 is connected to the weighting coefficient input 48 of a transversal filter 49 via the switch 42, and the output 50 of buffer 35 is connected to one changeover terminal 51 of switch 46. The other changeover terminal 52 of switch 46 is connected to the output 53 of the filter 49 and the pole 54 of switch 45 is connected to the input 55 of an adaptive filter 56 which also has a reference signal input 57 and an output 91. The input 58 of the transversal filter 49 is connected to the output 59 of a generator 60 for an auxiliary signal, this output 59 also being connected to the input 61 of a second transversal filter 62. The output 63 of filter 62 is connected to the reference signal input 57 of the adaptive filter 56 via a delay device 100.

Adaptive filter 56 comprises a transversal filter 64 to the input 65 of which the adaptive filter input 55 is connected. The output 66 of filter 64 is connected to the pole 67 of (changeover) switch 45. One changeover contact 68 of switch 45 is connected via the output 91 to the input 69 of a demodulator 70 which has an output 71. The other changeover contact 72 of switch 45 is connected to one input 73 of a subtractor 74 the other input 75 of which is fed from the reference signal input 57 of the adaptive filter 56. The output 76 of subtractor 74 is connected via switch 41 to the input 77 of a processing circuit 78 the output 79 of which is connected to the weighting coefficient input 80 of filter 64. When switch 39 is closed and switch 45 is in the other position to that shown processing circuit 78 adjusts in known manner the weighting coefficients of the filter 64 so as to minimise the output signal of the subtractor 74, i.e. so as to minimise the difference between the output signal of the filter 64 and the reference signal applied to reference waveform input 57 (these signals in fact being in digital form). There are many possible known algorithms which the processing circuit 78 may employ to do this and, in this respect, reference way be made, for example, to the book "Adaptive Filter Theory" by Simon Haykin (Prentice-Hall, 1986). The delay produced by delay device 100 is chosen so that the delays in the signal paths to subtractor 74 from source 60 via the filters 49 and 62 are equal to each other.

In operation the various switches are, for most of the time, in the positions shown. The desired signal received by the aerial is translated to low IF by the mixers 6 and 15, converted to digital form by the converter 21, delayed in the buffer or delay device 35 and transmitted to the input 69 of the demodulator 70 via the transversal filter 64. Demodulator 70 demodulates it to reproduce the modulation on its output 71. The low IF-translated signal is also clocked continuously into buffer 26 and correlator 28. The received signal takes the form of a carrier modulated in accordance with the format shown in FIG. 1. When a preamble 2 is received, translated to low IF, converted to digital form and clocked into correlator 28 the correlator will produce a signal at its output 29 as explained hereinbefore. When this output signal appears and is applied to input 32 of control logic circuitry 33, circuitry 33 is constructed to respond by first generating a signal at its output 37 to close switch 42 for a period t1, and then, i.e. when switch 42 opens again, generating signals at its output 36 to close switch 41 and charge over switches 45 and 46 for a period t2. The duration of thee period t1 is sufficient to allow the samples of the low IF translated preamble 2 stored in buffer or delay circuit 26, possibly together with samples of the end of the preceding guard band 3 and the start of the succeeding data burst 1, to be written into the transversal filter 49 as respective weighting coefficients for its various taps. The capacity of buffer 35 is sufficient to ensure that the data burst 1 following the relevant preamble 2 does not appear at its output 50 until or after the end of the period t2. The period t2 constitutes a tap weight adjustment period for the filter 64, switch 41 then being closed, switch 45 in its upper position and switch 46 in its lower position. During this period, therefore, the (digital) auxiliary signal appearing at the output 59 of source 60 is applied to both the input 55 of adaptive filter 56 via filter 49 and to the reference signal input 57 of filter 56 via filter 62.

Filter 62 is preloaded with weighting coefficients which correspond to samples of the ideal version of the low IF-translated preamble 2, i.e. of the preamble 2 which would appear at the output of converter 21 if the signal transmitted to the aerial 2 had not been distorted because of multi-path reflections etc., and no distortion had occurred between the aerial 2 and the converter 21. (This preloading is achieved by applying the ideal samples to a weighting coefficient input 81 of filter 62 via terminal 82). Thus, during the period t2 the output signal of source 60 is convolved in filter 49 with a waveform corresponding to the received and low IF-translated preamble 2 and is also convolved in filter 62 with an ideal version of this waveform, the result of the first convolution operation being applied to the input 55 of adaptive filter 56 and the result of the second convolution operation being applied to the reference signal input 57 of filter 56. Processing circuit 78 responds during the period t2 by adjusting the weighting coefficients of the taps of filter 64 to make the output signal of filter 64 correspond closely to the signal applied to reference signal input 57. In other words, the coefficients of filter 64 are adjusted so that this filter converts the output signal of source 60 as filtered by filter 49 into the form which the output signal of source 60 takes when it has been filtered by filter 62. It has been found that this adjustment of filter 64 corresponds to that required in order that filter 64 will convert the received low IF-translated preamble waveform applied to weighting coefficient input 48 of filter 49 into the ideal version of that waveform applied to weighting coefficient input 81 of filter 62, i.e. corresponds to that required to convert the possibly distorted low IF-translated received preamble waveform into a non-distorted or at least substantially less distorted version of that waveform. Because the duration of the period t2 can be chosen longer than the duration of the actual preamble the preamble can be shorter than it would otherwise have to be and/or a slower algorithm can be employed by processing circuit 78 to adjust the coefficients of filter 64 than would be required if the low IF-translated preamble itself were used as the input signal to adaptive filter 56.

At the end of the period t2 the switches 41, 45 and 46 are returned by control logic circuitry 33 to the positions shown, the low IF-translated data burst 1 which accompanies the relevant preamble 2 then being applied from buffer 35 to the demodulator 70 via filter 64 which now has a transfer characteristic which is such as to remove or at least substantially reduce the distortion present in this burst due, for example, to multipath reflections in the transmission channel to the aerial. In effect the transfer function of filter 64 has been adjusted to become substantially the inverse of that of the transmission channel, as required for equalization purposes.

It will be appreciated that a method and apparatus according to the invention may be used for purposes other than equalization. For example, if the connections from the outputs of the filters 49 and 62 to the filter 56 are reversed, i.e. output 53 is connected to input 57 and output 63 is connected to input 55, the result will be that the coefficients of filter 64 will be adjusted so that the transfer coefficient of filter 64 becomes substantially the same as that of the transmission channel, rather that its inverse. In such a case the resulting coefficients of filter 64 may be employed in a so-called Viterbi demodulator (which requires an estimation of the transfer function of the transmission channel).

The output way form of auxiliary signal source 60 (which waveform will, in the embodiment described, be in the form of a sequence of digital numbers) is preferably of a wide-band nature. Preferably, indeed, it is in the form of noise, in which case the digital numbers making up the aforesaid sequence will be effectively random. Because the same sequence of numbers outputted by source 60 will always result in the same sequence of digital numbers being outputted by filter 62 it may be arranged, if desired, that source 60 outputs the same sequence of digital numbers each time an adjustment of the coefficients of filter 64 is performed, i.e. during each period t2. If this is the case then filter 62 may be dispensed with, source 60 then being arranged to output successive pairs of digital numbers, one member of each pair being the number required for current application to the filter 49 and the other member of each pair being the corresponding number which would be outputted by filter 62 if it were present, this latter number now being applied direct from source 60 to input 57 of filter 56. In effect this means that the convolution of the samples of the ideal low IF-translated preamble 2 with the output sequence of source 60 has to be performed only once and the result stored in the source 60.

Control logic circuitry 33 may comprise a pair of timers, the first of which is actuated by the output signal of correlator 28, has a duration t1, and holds the output 37 at a specific logic level while it is running, and the second of which is actuated by expire at the first, holds the output 36 at a specific logic level while it is running, and has a duration t2. Switches 41, 42, 45 and 46 will of course be electronic switches. Buffers 26 and 35 may be in the form of conventional memory devices and each of correlator 28 and transversal filters 49, 62 and 64 may be in the form of an integrated circuit available from Inmos under the type number A100. (If this is the case the input 31 of correlator 28 will be constituted by the weighting coefficient input of the integrated circuit, the A100 taking the form of a 32-stage programmable transversal filter). If such 32-stage filters are employed the number of samples of the received low IF-translated preamble (and also possibly the final portion of the immediately preceding guard band and the initial portion of the immediately succeeding data burst) which are employed each time is weighting coefficients for the filter 49 may be, for example, thirty-two whereas the number of samples of the ideal low IF-translated preamble waveform employed as weighting coefficients for the filter 62 may be less than this, for example twenty. If desired, each such set of samples may itself be weighted with a suitable windowing function prior to its use as the filter weighting coefficients.

The digital parts of the apparatus shown in FIG. 2 will in practice be synchronized by means of a system clock, which has not been shown for the sake of clarity and simplicity. In fact the functions of some or all of these digital parts may be performed by means of a suitably programmed computer rather than the dedicated hardware described.

It will be appreciated that it is not essential that the filters 49 and 62 be included in respective ones of the signal paths from auxiliary signal source 60 to the subtractor 74; they may both be included in the same path. Thus, for example, filter 62 may be transferred to a point directly in cascade with filter 49 or between the output 72 of switch 45 and the input 73 of subtractor 74. If the characteristic of filter 62 remains the same, the coefficients of filter 64 will then be adjusted so that its transfer coefficient becomes substantially the same as the transmission channel, i.e. so that it becomes suitable for use as a channel estimator, whereas if the transfer characteristic of filter 62 is changed to its inverse the coefficients of filter 64 will again be adjusted so that the filter becomes suitable for use as a channel equaliser. Similarly, filter 49 may be transferred to a point in cascade with filter 62. If the transfer characteristic of filter 62 remains the same, the coefficients of filter 64 will then be adjusted so that filter 64 becomes suitable for use as a channel estimator, whereas if the transfer characteristic of filter 62 is changed to its inverse, the coefficients of filter 64 will then be adjusted so that filter 64 again becomes suitable for use as a channel equaliser. Similar changes between the adjustment of filter 64 for channel estimator and channel equalizer purposes may, of course, be effected by changing the characteristic of filter 49 to its inverse. The coefficients of a given filter having a transfer characteristic which is the inverse of that of a further filter may be calculated by connecting both filters in cascade, feeding the resulting cascade combination with an input signal, for example a noise signal, and adjusting the coefficients of the given filter by adaptive filter techniques so that the resulting output signal of the combination is substantially the same as the input signal. The coefficients of the further filter may be considered to be samples of a specific signal with which the further filter convolves its input signal, the coefficients of the given filter than becoming adjusted so that they become samples of the inverse of the specific signal.

It is known in data receivers of the general kind described with reference to FIG. 2 to replace the single mixer 15 by first and second mixers constructed to translate the output signal of IF amplifier 12 into respective members of a pair of quadrature-related zero-IF signals, these signals then being processed, inter alia by passing each one through a respective pair of equalising filters, to form a pair of signals suitable for application to in-phase and in-quadrature inputs respectively of the demodulator. The present invention may be employed in such a receiver, and an example of how this can be done will now be described with reference to FIG. 3, which is a block diagram of an alternative to part of the receiver of FIG. 2.

Figure 3:
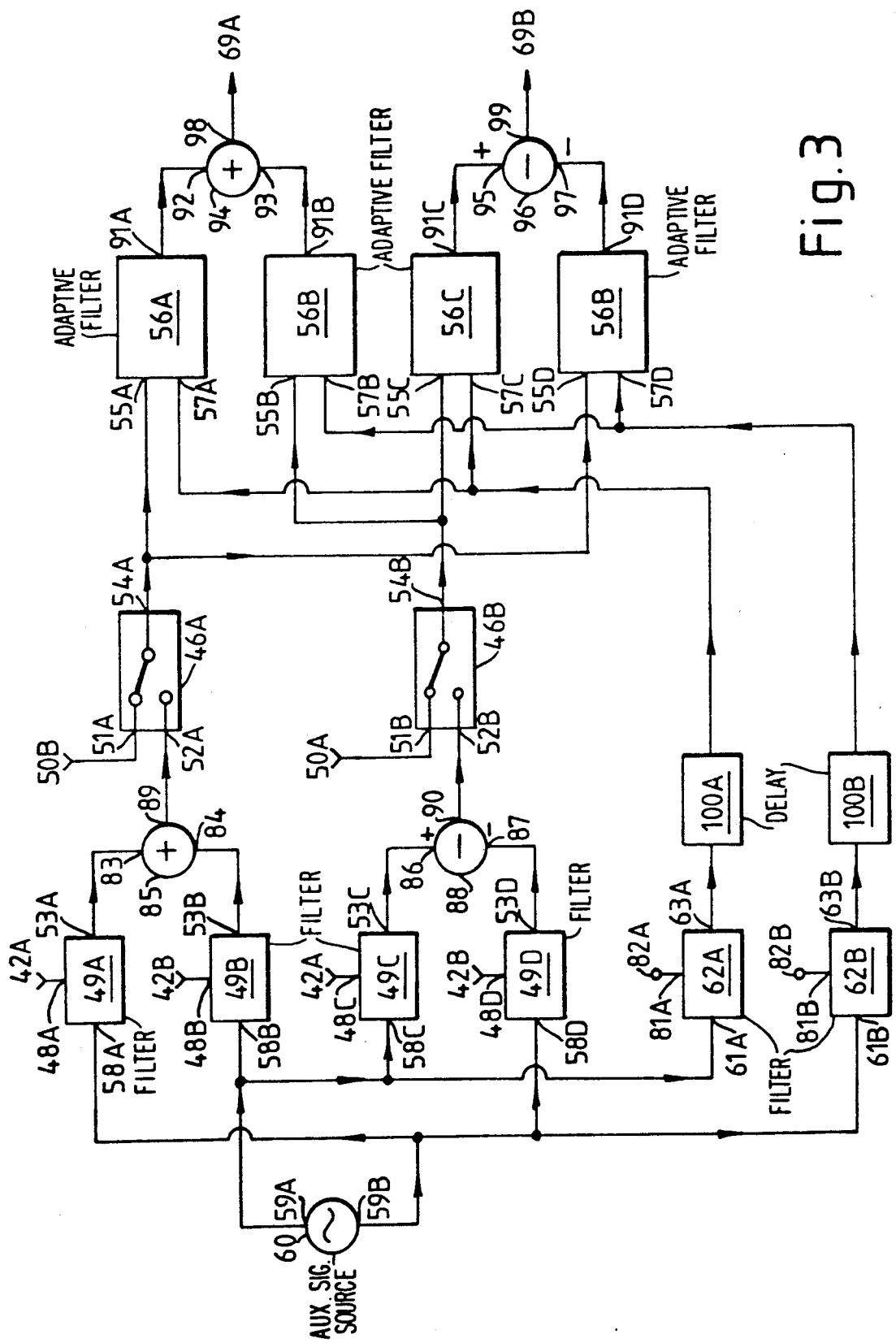

As shown in FIG. 3, the source 60 for the auxiliary signal now has two output 59A and 59B at which it generates mutually orthogonal signals. (If the source 60 is a noise source this means that there is no correlation between the noise generated at one output and the noise generated at the other, and such orthogonal noise signals may be generated by employing two completely independent noise sources the output signals of which have the same mean value and the same standard deviation, these sources feeding the outputs 59A and 59B respectively). The filter 49 of FIG. 2 has been replaced by four filters 49A, 49B, 49C and 49D, with the inputs 58B and 58C of filters 49B and 49C fed from the output 59A of source 60 and the inputs 58A and 58D of filters 49A and 49D fed from the output 59B of source 60. The outputs 53A and 53B of filters 49A and 49B are connected to inputs 83 and 84 respectively of an adder 85, and the outputs 53C and 53D of filters 49C and 49D are connected to inputs 86 and 87 respectively of a subtractor 88. The switch 46 of FIG. 2 has been replaced by a pair of switches 46A and 46B (both controlled by the signal at the output 36 of control logic circuitry 33), the output 89 of adder 85 being connected to the input 52A of switch 46A and output 90 of subtractor 88 being connected to the input 52B of switch 46B. The adaptive filter 56 of FIG. 2 has been replaced by for adaptive filters 56A, 56B, 56C and 56D, the inputs 55A and 55D of filters 56A and 56D being fed from the output 54A of switch 46A and the inputs 55B and 55C of filters 56B and 56C being fed from the output 54B of switch 46B. The outputs 91A and 91E of filters 56A and 56B are connected to respective inputs 92 and 93 of an adder 94 and the outputs 91C and 91D of filters 56C and 56D are connected to respective inputs 95 and 96 of a subtractor 97. The switches (not shown) which correspond to the switches 41 and 45 of FIG. 2 and which are provided in each of the filters 56A, 56B, 56C and 56D are controlled by the signal at the output 36 of the control logic circuitry 33. The remodulator 70 of FIG. 2 has been replaced by a demodulator (not shown) which operates on quadrature components of zero IF-translated signals, these being applied to respective inputs 69A and 69B thereof from the outputs 98 and 99 of the adder 94 and the subtractor 97 respectively. The filter 62 of FIG. 2 has been replaced by a pair of filters 62A and 62B the respective inputs 61A and 61B of which are fed from the outputs 59A and 59B of source 60. The output 63A of filter 62A is connected to the reference signal inputs 57A and 57C of the filters 56A and 56C via delay means 100A, and the output 63B of filter 62B is connected to the reference signal inputs 57B and 57D of the filters 56B and 56D via delay means 100B.

Although not shown in FIG. 3 a duplicate is also provided of the arrangement comprising the components 21,28,35,26 and 42 of FIG. 2, this duplicate being fed from a duplicate of mixer 15 which provides an output signal which is in quadrature with the output signal of the mixer 15. The output of switch 40 (now termed 42A) is now connected to the weighting coefficient inputs 48A and 48C of the filters 49A and 49C respectively and the output of the duplicate of switch 42 (termed 42B) is connected to the weighting coefficient inputs 48B and 48D of the filters 49B and 49D respectively. The output 50 (now termed 50A) of buffer 35 is connected to the input 51B of switch 46B and the output (termed 50B) of the duplicate of buffer 35 is connected to the input 51A of switch 46A. A replica, in the form of samples, of the I-component of the ideal zero IF-translated preamble signal as it would appear at the output of converter 21 is preloaded into filters 62A and 62B via their weighting coefficient inputs 81A and 81B so that these samples act as respective weighting coefficients for the various taps of each of these filters. This replica is also preloaded into correlator 28 and its duplicate, it being assumed for the purpose of FIG. 3 that the transmitter of the received signal is arranged to transmit a preamble having only an I-component. In this case the output signals of correlator 28 and its duplicate are squared and the results added together to produce the signal applied to the input 32 of control logic circuitry 33.

If the output signal of switch 42A is the in-phase component I of the received zero IF-translated preamble signal and the output of switch 42B is the in-quadrature component Q thereof (a non-zero quadrature component being liable to occur at the receiver due to distortions occurring in the transmission channel) which signal is in-phase and which is in-quadrature being arbitrarily chosen and simply indicating the sense or direction of the quadrature relationship between the two, and if the signal appearing at output 59A of source 60 is the in-phase component I of the auxiliary signal generated thereby and the signal appearing at output 59B thereof is the in-quadrature component Q thereof, this being determined in the case of the outputs 59A and 59E being the mutually orthogonal outputs of respective independent noise sources by the fact that output 59A is connected to filters 49B and 49C the weighting coefficients of which correspond to the Q and I components respectively of the received preamble signal and which feed adder 85 and subtractor 88 respectively and output 59B is connected to filters 49A and 49B the weighting coefficients of which correspond to the I and Q components respectively of the received preamble signal and which feed adder 85 and subtractor 88 respectively, then it will be noted that filters 49A and 49B are each supplied with an I and a Q signal, filter 49C is supplied with two I signals, and filter 49D is supplied with two Q signals. The output signals of filters 49A and 49E are therefore Q signals and the output signals of filters 49C and 49D are therefore I signals, the output signal of filter 49D being of opposite phase to the output signal of filter 49C. The output signals of filters 49A and 49B are arithmetically combined with appropriate sign in adder 85 to give a resulting Q signal and the output signals of filters 49C and 49D are arithmetically combined with appropriate sign in subtractor 88 to give a resulting I signal. When they are in the adaptation mode the adaptive filters 56A, 56B, 56C and 56D are therefore supplied with a Q signal from switch 46A and an I signal from filter 62A, an I signal from switch 46B and a Q signal from filter 62B, I signals from both switch 46B and filter 62A, and Q signals from both switch 46A and filter 62B, respectively. When they are in the channel equalisation mode the output signals of filters 56A and 56B are therefore both Q signals which are arithmetically combined with appropriate sign in adder 94 and applied to the Q signal input 69A of the demodulator, and the output signals of filters 56C and 56D are therefore both I signals which are arithmetically combined with appropriate sign in subtractor 87 and applied to the I signal input 69B of the demodulator.

Similarly to what has already been described with reference to FIG. 2, the connections to the inputs 55A and 57A of filter 56A in FIG. 3 may be transposed, as may the connections to the inputs 55B and 57B of filter 56B, the inputs 55C and 57C of filter 56C, and the inputs 55D and 57D of filter 56D in which case the coefficients of the filters 56A and 56B will become adjusted in such a way that they become suitable for use, for example, as channel estimation coefficients for a Viterbi demodulator. Moreover the alternative positions and characteristics for the filters 49 and 62 already described with reference to FIG. 2 are also applicable to the arrangement of FIG. 3. Thus, for example, filters 62A and 62B may be replaced by direct connections, filters having the inverse characteristics to filters 62A and 62B then being provided in the inputs or outputs of filters 49A, 49B, 49C and 49D, respectively, for example by including a filter having the inverse characteristic of filters 62A and 62B between the output 59A of source 60 and the inputs 58B and 58C of filters 49B and 49C, and another filter having the inverse characteristic of filters 62A and 62B between the output 59B of source 60 and the inputs 58A and 58D of filters 49A and 49D, direct connections then being provided from outputs 59A and 59B to delay devices 100A and 100B respectively. As another example the filters 62A and 62B may be replaced by direct connections, filters having the inverse characteristic to filters to 62A and 62B the being provided in filters 56A, 56B, 56C and 56D, at points therein corresponding to the connection from output 72 of switch 45 to input 73 of subtractor 74 in FIG. 2.

Again, similarly to what has been already described with reference to FIG. 2, the signals produced at the outputs 63A and 63B of filters 62A and 62B may instead be produced directly at a pair of further outputs (not shown) of source 60 if, for example, source 60 is suitably programmed to generate a sequence of groups of four digital numbers having the required interrelationship, one at each of the four outputs then provided.

Figure 4:
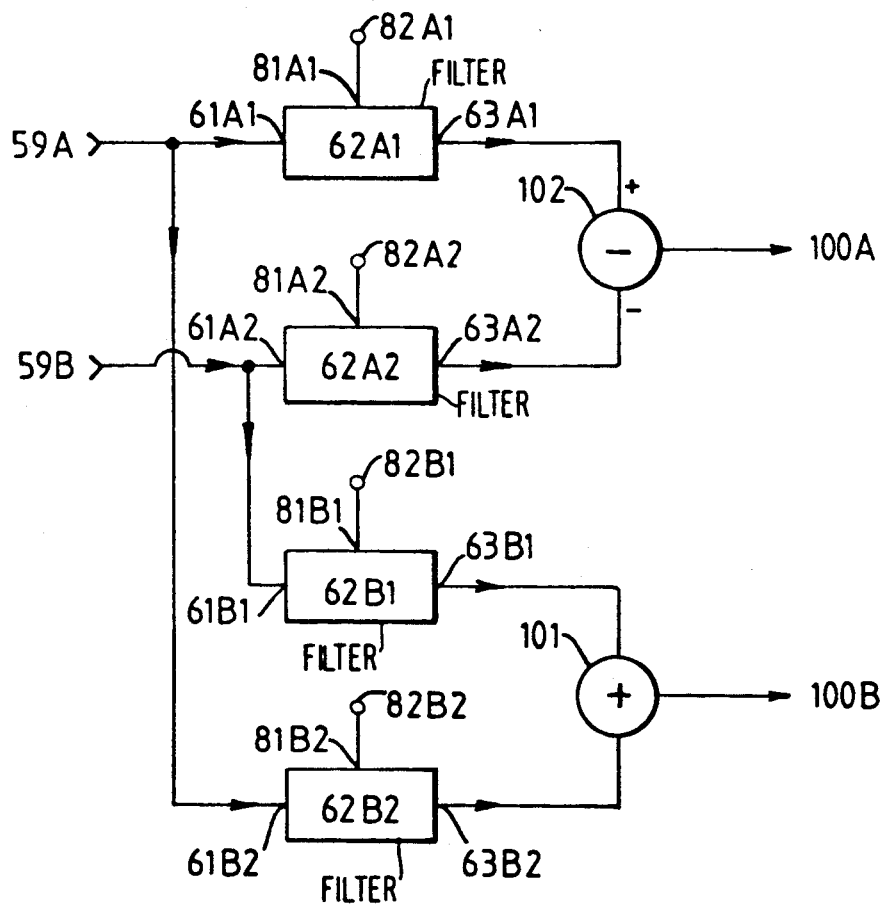

As stated above, it has been assumed for the purpose of FIG. 3 that the transmitter of the received signal is arranged to transmit a preamble having only an I component. If this is not the case, i.e. if the transmitted preamble signal has both an I and a Q component, the filters 62A and 62B of FIG. 3 may be replaced by four filters, 62A1, 62A2, 62B1 and 62B2, an adder 10 and a subtractor 102 as shown in FIG. 4, i.e. configured similarly to filters 49A.-D, adder 85 and subtractor 88. More particularly the inputs 61A1 and 61B2 of filters 62A1 and 62B2 respectively are fed from the output 59A of source 60, and the inputs 61A2 and 61B1 of filters 62A2 and 62B1 respectively are fed from the output 59B of source 60. The outputs 63A1 and 63A2 of filters 62A1 and 62A2 respectively feed the delay device 100A via respective inputs and the output of subtractor 102 and the outputs 63B1 and 62B2 of filters 62B1 and 62B2 respectively feed the delay device 100B via respective inputs and the output of adder 101. Filters 62A1 and 62B1 are each preloaded via their weighting coefficient inputs 81A1 and 81B1 with a replica, in the form of samples, of the I-component of the ideal zero-IF translated preamble signal as it would appear at the output of converter 21 so that these samples act as respective weighting coefficients for the various taps on each of these filters. Similarly filters 62A2 and 62B2 are each preloaded via their weighting coefficient inputs 81A2 and 81B2 with a replica, in the form of samples, of the Q-component of the ideal zero-IF-translated preamble signal as it would appear at the output of the duplicate of converter 21 so that these samples act as respective weighting coefficients for the various taps on each of these filters. In such a case the correlators 28 and its duplicate may similarly be replaced by four filters, an adder and a subtractor, configured as shown in FIG. 4, the two inputs of the configuration being fed from the outputs of the I and Q channel mixers respectively and the output signals of the adder and subtractors being squared and the results added together to produce the signal applied to the input 32 of the control logic circuitry 33.

The functions of some or all of the various blocks shown in FIG. 3 may be performed by a suitably programmed computer.

Although the invention has been described in the context of a communications receiver for radio signals having the general modulation format shown in FIG. 1 it will be appreciated that it may also be applied in other contexts.

From reading the present disclosure, other modifications will be apparent to persons skilled in the art. Such modifications may involve other features which are already known in the design, manufacture and use of arrangements and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relate to the same invention as presently claimed in any claim and whether or not it mitigates any or all of the same technical problems as does the present invention. The applicants hereof give notice the new claims may be formulated to such features and/or combinations of such features during the prosecution of the present application or of any further application derived therefrom.

We claim:

1. A method of adjusting the coefficients of a filter means, in which method an input signal is supplied to the filter means, a resulting signal derived from the filter means is compared with a reference signal, and the coefficients are adjusted to reduce the difference between the compared signals, characterized in that:
   the input signal and the reference signal, and hence the compared signals, are both derived from a common auxiliary signal source;
   the derivation of one of the compared signals from the output signal of the source includes a convolution operation with a first further signal and the derivation of said one or the other of the compared signals from the output signal of the source includes, at least effectively, a convolution operation with a second further signal.

2. A method as claimed in claim 1, which method is activated in response to significant correlation occurring between a signal occurring in a signal path through a communications receiver and a signal of which said second further signal or the inverse thereof is at least a component, the signal occurring in the signal path or the inverse thereof being utilised as at least part of said first further signal.

3. A method as claimed in claim 2, wherein the auxiliary signal source is a noise signal source for generating a random auxiliary signal.

4. A method as claimed in claim 2, in which the input of the filter means is connected to said signal path when the coefficients have been adjusted.

5. A method as claimed in claim 1, wherein the auxiliary signal source is a noise signal source.

6. A method as claimed in claim 4, wherein the auxiliary signal source is a noise signal source.

7. An arrangement comprising a filter means provided with coefficient adjusting means for, when activated, supplying an input signal to the filter means, comparing a resulting signal derived from the filter means with a reference signal, and adjusting the coefficients to reduce the difference between the compared signals, characterised in that:
   the arrangement includes an auxiliary signal source and means for deriving, when the coefficient adjusting means is activated, both said input signal and said reference signal, and hence both the compared signals, from the output signal of said auxiliary signal source; the derivation of one of the compared signal including a convolution operation with a first further signal, and the derivation of said one or the other of the compared signals including, at least effectively, a convolution operation with a second further signal.

8. An arrangement as claimed in claim 7, wherein the auxiliary signal source is a noise signal source.

9. An arrangement as claimed in claim 7, included in a communications receiver, the arrangement further including correlation means for detecting significant correlation between a signal occurring in a signal path through said receiver and a signal of which said further signal or the inverse thereof is at least a component and activating said adjusting means in response thereto, and means for utilising the signal occurring in the signal path or the inverse thereof as at least part of said first further signal.

10. An arrangement as claimed in claim 7, further including means for connecting the input of the filter means to a signal path when the coefficients have been adjusted.

11. A communications receiver including an arrangement as claimed in claim 7 for filtering a received signal prior to demodulation of the received signal.

12. An arrangement as claimed in claim 8, included in a communications receiver, the arrangement further including correlation means for detecting significant correlation between a signal occurring in a signal path through said receiver and a signal of which said second further signal of the inverse thereof is at least a component and activating said adjusting means in response thereto, and means for utilizing the signal occurring in the signal path or the inverse thereof as at least part of said first further signal.

13. An arrangement as claimed in claim 8, further including means for connecting the input of the filter means to a signal path when the coefficients have been adjusted.

14. An arrangement as claimed in claim 9, further including means for connecting the input of the filter means to said signal path when the coefficients have been adjusted.

15. A method of adjusting the coefficients of a filter means, in which method an input signal is supplied to the filter means, a resulting signal derived from the filter means is compared with a reference signal, and the coefficients are adjusted to reduce the difference between the compared signals, characterised in that:

the input signal and the reference signal, and hence the compared signals, are both derived from an auxiliary signal source having a pair of outputs for respective ones of mutually orthogonal auxiliary signals; the derivation of one of the compared signals including convolution operations of the output signals of the source respectively with respective quadrature components of a first further signal and combination of signals resulting from said convolution operations; and the derivation of said one or the other of the compared signals including, at least effectively, a convolution operation of at least one of the output signals of the source with a second further signal.

16. A method as claimed in claim 15, wherein the auxiliary signal source is a noise signal source for generating a random auxiliary signal.

17. A method as claimed in claim 15, which method is activated in response to significant correlation occurring between a signal occurring in a signal path through a communications receiver and a signal of which said second further signal or the inverse thereof is at least a component, the signal occurring in the signal path or the inverse thereof being utilised as at least part of said first further signal.

18. A method as claimed in claim 17, in which the input of the filter means is connected to said signal path when the coefficients have been adjusted.

19. A method for adjusting filter coefficients of a filter means, comprising the steps of:
a. deriving an input signal and a reference signal from an output of an auxiliary source, including the substep of convolving the output of the auxiliary source with first and second further signals;
b. supplying the input signal to the filter means to derive a resulting signal;
c. comparing the resulting signal with the reference signal; and
d. adjusting the filter coefficients to reduce a difference between the resulting signal and the reference signal.

20. The method of claim 19 wherein
the deriving step comprises convolving first and second orthogonal outputs of the auxiliary source with respective quadrature components of the first and second further signals to form the input and reference signals.

21. An arrangement comprising a filter means provided with coefficient adjusting means for, when activated, supplying an input signal to the filter means, comparing a resulting signal derived from the filter means with a reference signal, and adjusting the coefficients to reduce the difference between the compared signals, characterised in that;

the arrangement includes an auxiliary signal source having a pair of outputs for respective ones of mutually orthogonal output signals; and means for deriving, when the coefficient adjusting means is activated, both said input signal and said reference signal, and hence both the compared signals, from said auxiliary signal source; the derivation of one of the compared signals including convolution operations of the output signals of the source respectively with respective quadrature components of a first further signal and combination of signals resulting from said convolution operations; and the derivation of said one or the other of the compared signals including, at least effectively, a convolution operation of at least one of the output signals of the source with a second further signal.

22. An arrangement as claimed in claim 21, further including means for connecting the input of the filter means to a signal path when the coefficients have been adjusted.

23. An arrangement as claimed in claim 21, wherein the auxiliary signal source is a noise signal source.

24. An arrangement as claimed in claim 21, included in a communications receiver, the arrangement further including correlation means for detecting significant correlation between a signal occurring in a signal path through said receiver and a signal of which said second further signal or the inverse thereof is at least a component and activating said adjusting means in response thereto, and means for utilizing the signal occurring in the signal path or the inverse thereof as at least part of said first further signal.

* * * * *